(12) United States Patent
Tsai et al.

(10) Patent No.: US 8,895,447 B2
(45) Date of Patent: Nov. 25, 2014

(54) SEMICONDUCTOR HOLE STRUCTURE

(75) Inventors: Nien-Yu Tsai, Hsinchu (TW); Wei Ming Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 82 days.

(21) Appl. No.: 13/608,794

(22) Filed: Sep. 10, 2012

(65) Prior Publication Data

US 2014/0070373 A1    Mar. 13, 2014

(51) Int. Cl.
*H01L 21/311* (2006.01)

(52) U.S. Cl.
USPC .......................................... 438/701

(58) Field of Classification Search
CPC ........... H01L 2924/01078; H01L 2924/01079; H01L 2924/01029; H01L 2924/237481; H01L 23/5226
USPC .......... 257/774, 618, 763, 758, 773; 438/701, 438/700, 713, 629, 637, 639–640, 667–668, 438/672, 675
See application file for complete search history.

(56) References Cited

U.S. PATENT DOCUMENTS

2013/0334702 A1*  12/2013  Lee ................................ 257/774

\* cited by examiner

*Primary Examiner* — Hoa B Trinh
(74) *Attorney, Agent, or Firm* — Baker & McKenzie LLP (57) ABSTRACT

A first dielectric layer is formed over a substrate. A second dielectric layer is formed over the first dielectric layer. A first opening is formed in the second dielectric layer. A second opening is formed in the first dielectric layer.

13 Claims, 7 Drawing Sheets

SEMICONDUCTOR HOLE STRUCTURE

BACKGROUND

The present application relates generally to semiconductor devices and includes methods and structures for improving hole structures.

An important capability for manufacturing reliable integrated circuits is to precisely shape the individual structures that form the integrated circuits. One such structure is a contact hole. Integrated circuits may comprise multiple layers, and contact holes are implemented between each layer to allow electrical communication between neighboring layers. Conventional integrated circuits may use millions of contact holes with a precise uniform width or critical dimension (CD).

The contact holes may provide a connection to an interface region that reduces contact resistance such as a Co-silicide. Etching processes may remove material from the interface region or punch through it completely resulting in increased contact resistance. The etching processes may also reduce a critical dimension (CD) of the contact holes' opening which may also increase contact resistance.

It would be desirable to form structures such as contact holes with improved characteristics to provide, for example, better contact performance.

SUMMARY

According to an aspect, a first dielectric layer is formed over a substrate. A second dielectric layer is formed over the first dielectric layer. The second dielectric layer is patterned. A first opening is formed in the second dielectric layer. A second opening is formed in the first dielectric layer. A profile of the second opening is more vertical than a profile of the first opening.

According to another aspect, a semiconductor structure includes a first dielectric layer and a second dielectric layer. The first dielectric layer is formed over a substrate. The substrate includes an interface region of a material different than a material of the substrate. The second dielectric layer is formed over the first dielectric layer. The first and second dielectric layers include a hole structure located above the interface region of the substrate. A profile of the hole structure in the first dielectric layer is more vertical than a profile of the hole structure in the second dielectric layer.

DETAILED DESCRIPTION

Figure 1A:
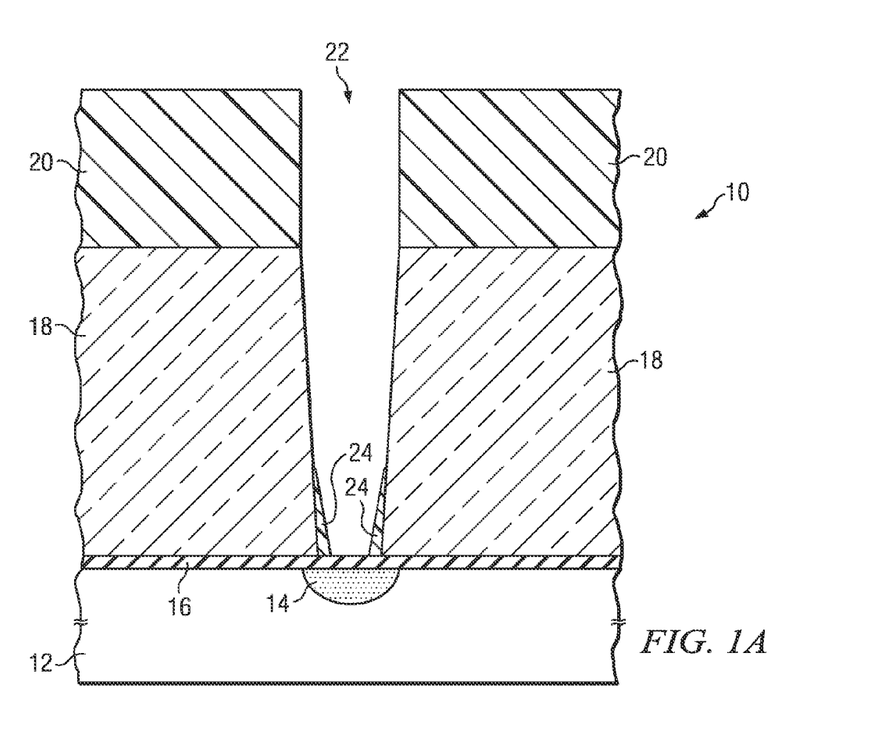
FIGS. 1A-D are cross-sectional views of a semiconductor device.

Referring to FIG. 1A, a semiconductor device 10 includes a substrate 12. An interface region 14, such as Co-silicide, is formed in the substrate 12. The interface region 14 may also be other materials such as a Ti-silicide or a Ni-silicide. The interface region 14 may reduce contact resistance. A first dielectric layer 16 is formed on the substrate 12. The first dielectric layer 16 may include, for example, SiN or SiON and may be an antireflective coating. A second dielectric layer 18 is formed on the first dielectric layer 16. The second dielectric layer 18 may be, for example, boro-phosphosilicate glass (BPSG), high density plasma (HDP) oxide, or other conformal undoped oxide. A photo resist layer 20 is formed on the second dielectric layer 18. An opening 22 is formed in the second dielectric layer 18 by etching the second dielectric layer 18 using the patterned photo resist layer 20 as a mask. The etching may be an anisotropic oxide etch using, for example, carbon fluoride ($CF_4$, $CHF_3$, $C_4F_8$, $C_5F_8$, $C_4F_6$, $C_3F_8$), Ar or $O_2$ chemistries. A polymer remainder 24, which may be a byproduct of the etching, is left on a bottom portion of the sidewall of the opening 22 after the etching of the second dielectric layer 18.

Figure 1B:
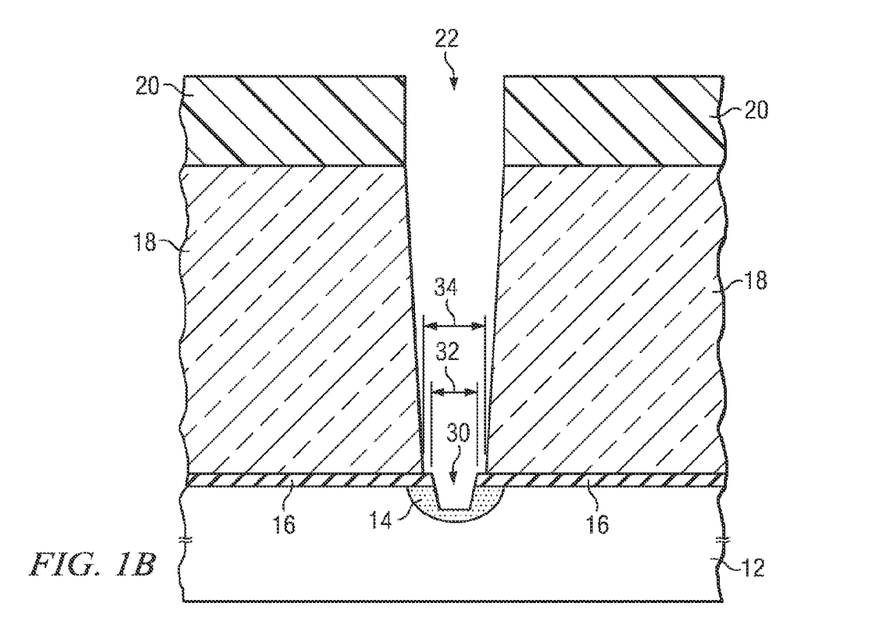

Referring to FIG. 1B, an opening 30 is formed in the first dielectric layer 16 by etching the first dielectric layer 16 using the photo resist layer 20 as a mask. The etching may be separate, for example in a different chamber, than the etching that formed the opening 22 but the same photo resist mask is used. A portion of the interface region 14 is also removed by the etching process. Also, the dimension 32 of the opening 30 in the first dielectric layer 16 is smaller than the dimension 34 of the opening 22 in the second dielectric layer 18 due to the presence of the polymer remainder 24 when the etching of the first dielectric layer 16 is performed.

Figure 1C:
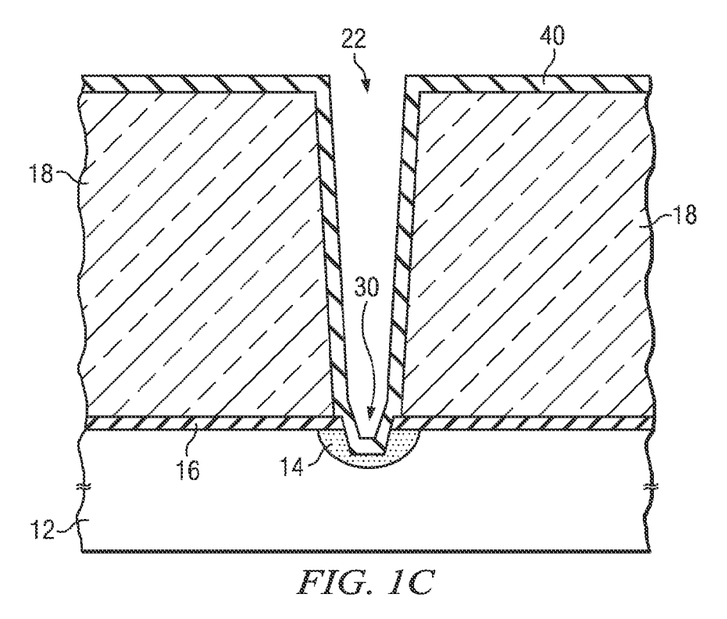

Referring to FIG. 1C, the photo resist layer 20 is removed and an insulating layer 40 is formed on the walls of the opening 22/30. The insulating layer 40 provides prevention against a contact to contact short and may be, for example, a thin SiN liner.

Figure 1D:
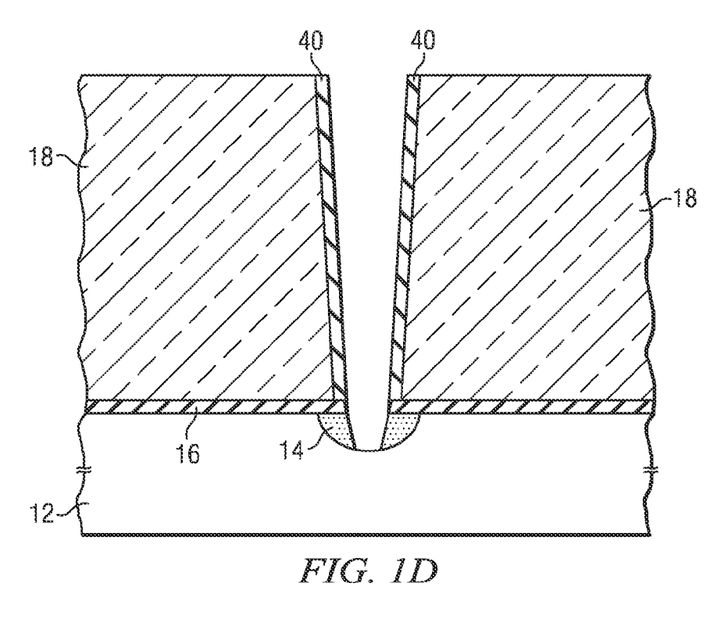

Referring to FIG. 1D, a bottom portion of the insulating layer 40 is anisotropically etched (for example using a $CHF_3$ or $CH_2F_2$ chemistry) to expose the interface region 14 so that a conductive plug may be formed later. The etching removes material from both the insulating layer 40 and the interface region 14.

Thus, in the above-described process, the interface region 14 is exposed to etching twice, which results in high contact resistance and possibly punch through of the interface region 14.

Figure 2A:
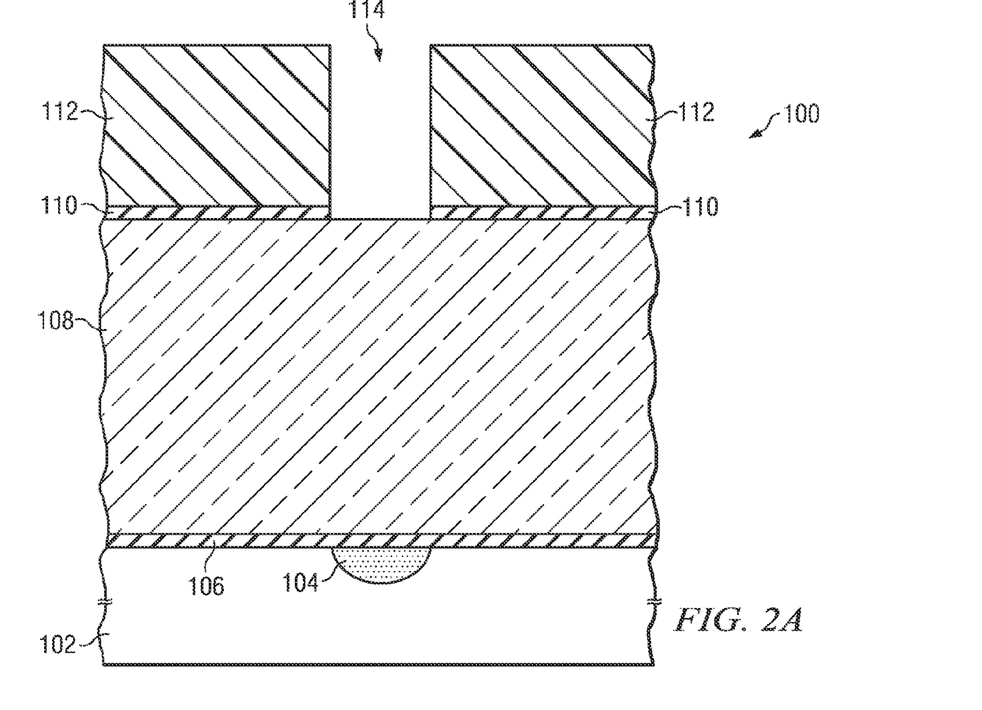
FIGS. 2A-F are cross-sectional views of a semiconductor device, in accordance with the present disclosure.
Figure 2B:
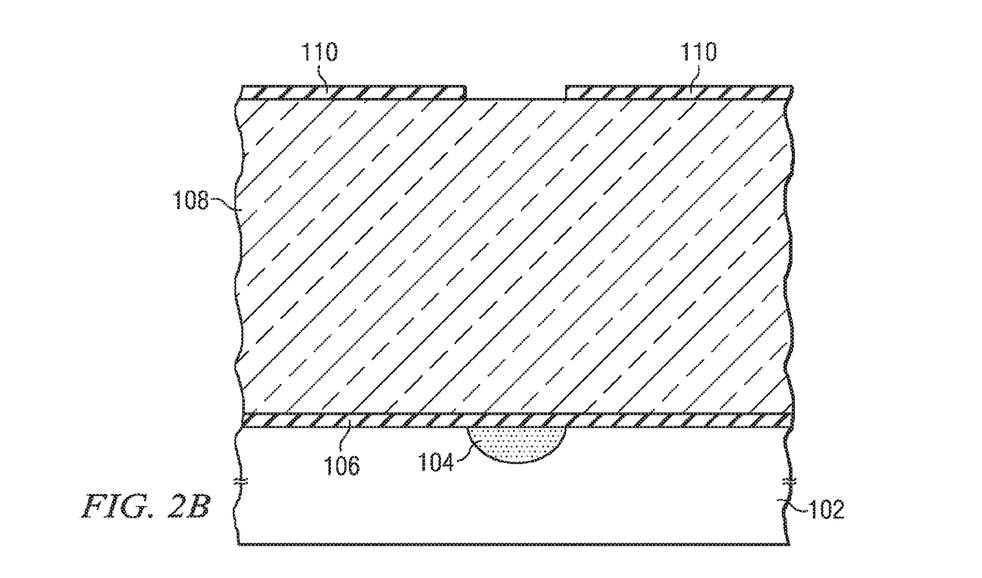
Figure 2C:
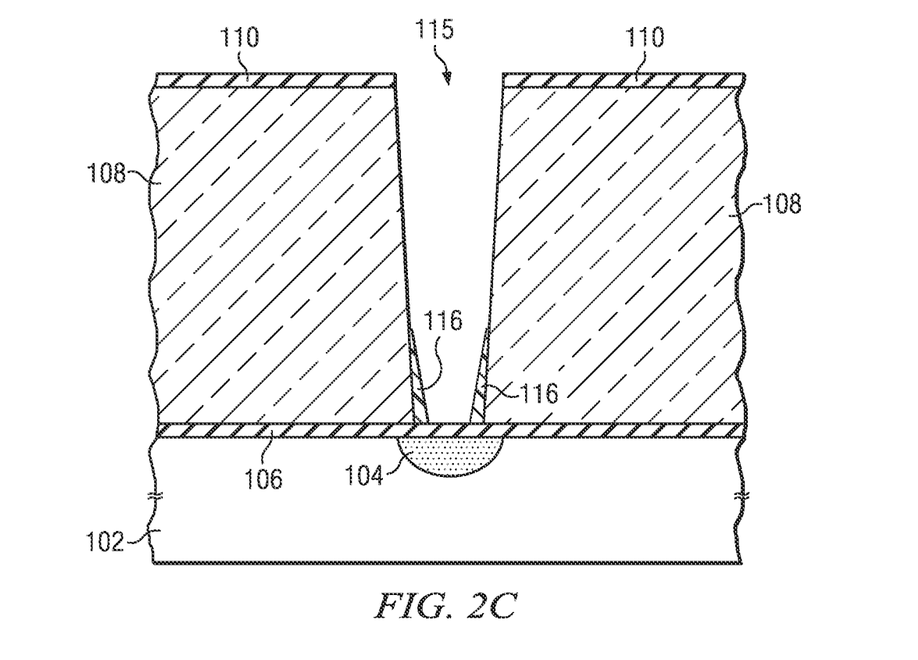

Referring to FIG. 2A, a semiconductor device 100 includes a substrate 102. An interface region 104, such as Co-silicide, is formed in the substrate 102. In some embodiments, the interface region 104 may be other materials such as a Ti-silicide or a Ni-silicide. The interface region 104 may reduce contact resistance. A first dielectric layer 106 is formed on the substrate 102. The first dielectric layer 106 may include, for example, SiN or SiON. A second dielectric layer 108 is formed on the first dielectric layer 106. The second dielectric layer 108 may be, for example, BPSG. A hard mask layer 110 is formed on the second dielectric layer. The hard mask layer 110 may be, for example, poly, SiN, or amorphous carbon (APF). A photo resist layer 112 is formed on the hard mask layer 110. An opening 114 is formed in the hard mask layer 110 by etching the hard mask layer 110 using the patterned photo resist layer 112 as a mask. The photo resist layer 112 may then be removed, as shown in FIG. 2B. The second dielectric layer 108 is etched using the hard mask layer 110 as a mask, as shown in FIG. 2C, to form the opening 115. The etching may be an anisotropic oxide etch using, for example, carbon fluoride ($CF_4$, $CHF_3$, $C_4F_8$, $C_5F_8$, $C_4F_6$, $C_3F_8$), Ar or $O_2$ chemistries. A polymer remainder 116, which may be a byproduct of the etching, is left on a bottom portion of the sidewall of the opening 115 after the etching of the second dielectric layer 108. There may be some loss of the first dielectric layer 106 from the etching. The etching is preferably stopped before the first dielectric layer 106 is etched through.

Figure 2D:
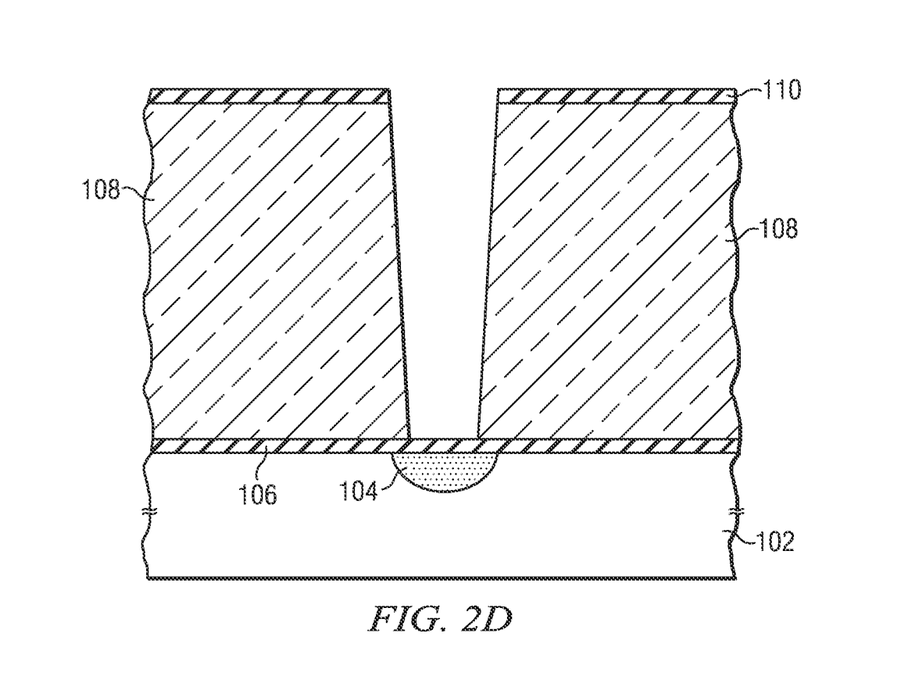

Referring to FIG. 2D, the polymer remainder 116 is removed, for example, by a $O_2$ plasma ashing and wet cleaning. The interface region 104 is protected from the removal process of the polymer remainder 116 by the presence of the first dielectric layer 106.

Figure 2E:
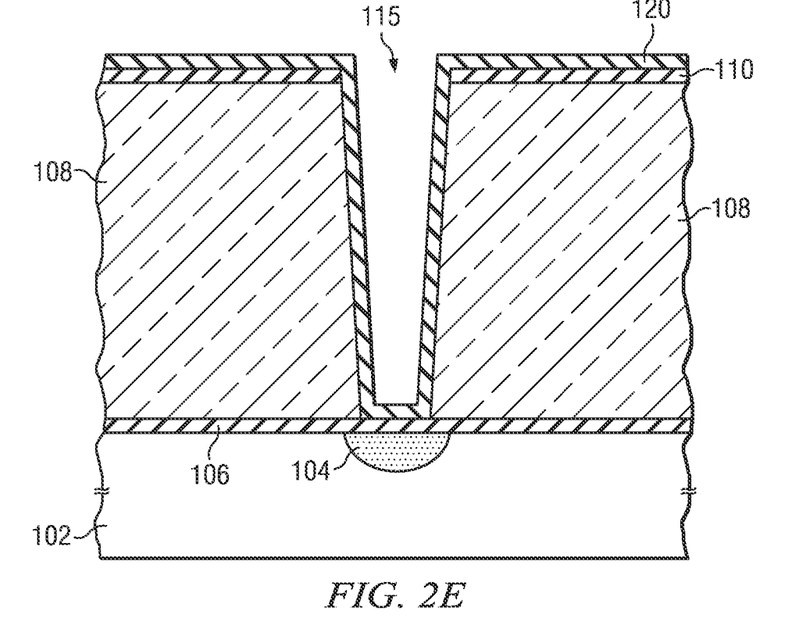

Referring to FIG. 2E, an insulating layer 120 is formed on the walls of the opening 115, the first dielectric layer 106 and the second dielectric layer 108. The insulating layer 120 provides prevention against a contact to contact short and may be, for example, a thin SiN liner, a tetraethyl orthosilicate (TEOS) layer, an undoped silicon glass (USG) layer, a SiON layer, or another conformal dielectric layer. An exemplary benefit of the insulating layer 120 is to seal the walls of the opening 115.

Figure 2F:
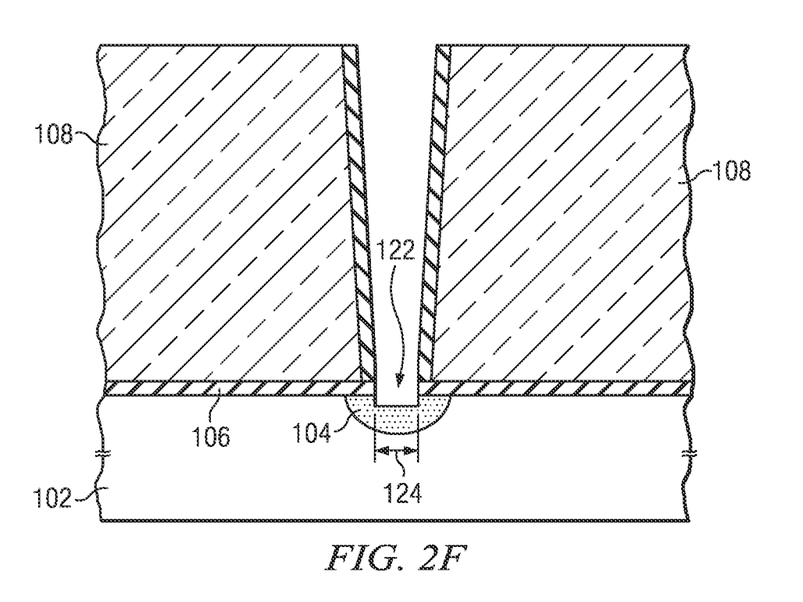

Referring to FIG. 2F, the insulating layer 120 is anisotropically etched (for example using a $CF_4$, $CHF_3$ or $CH_2F_2$ chemistry) exposing the interface region 104 at the opening 122 so that a conductive plug may be formed later. The etching may remove some material from the interface region 104.

A dimension 124 of the opening 122 is enlarged by the removal of the polymer remainder prior to the etching that provides the opening 122. Thus, a smoother contact hole may be provided because the discontinuity in the wall of the contact hole caused by the polymer remainder has been suppressed. The sidewall of the contact hole may be substantially smooth. The profile of opening 122 is more vertical than the profile of opening 115.

Figure 3A:
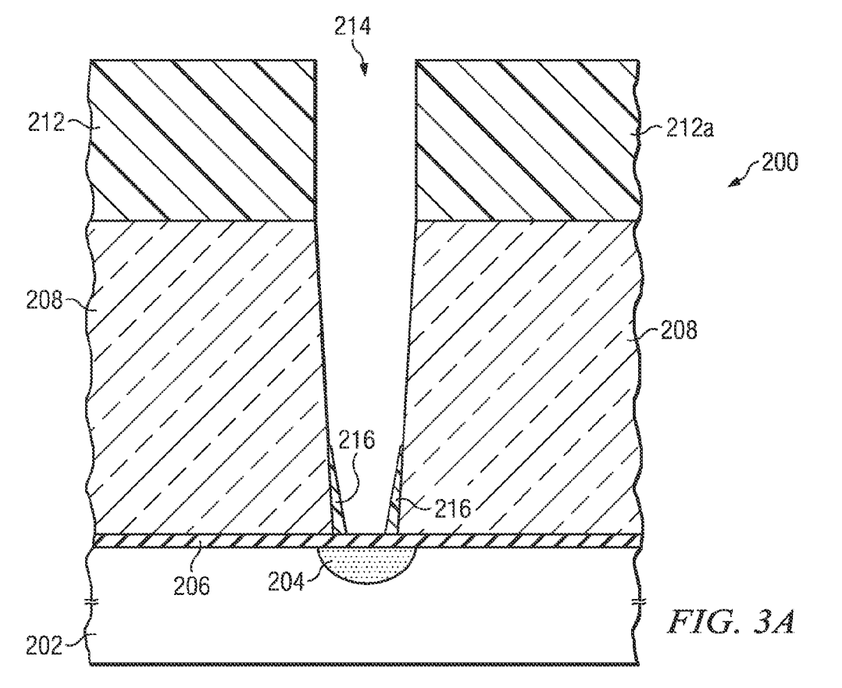
FIGS. 3A-D are cross-sectional views of a semiconductor device, in accordance with the present disclosure.

In another embodiment, a semiconductor device 200 includes a substrate 202, as shown in FIG. 3A. An interface region 204, such as Co-silicide, is formed in the substrate 202. In some embodiments, the interface region 204 may be other materials such as a Ti-silicide or a Ni-silicide. The interface region 204 may reduce contact resistance. A first dielectric layer 206 is formed on the substrate 202. The first dielectric layer 206 may include, for example, SiN or SiON. A second dielectric layer 208 is formed on the first dielectric layer 206. The second dielectric layer 208 may be, for example, BPSG. A photo resist layer 212 is formed on the second dielectric layer 208. An opening 214 is formed in the second dielectric layer 208 by etching the second dielectric layer 208 using the patterned photo resist layer 212a as a mask. The etching may be an anisotropic oxide etch using, for example, carbon fluoride ($CF_4$, $CHF_3$, $C_4F_8$, $C_5F_8$, $C_4F_6$, $C_3F_8$), Ar or $O_2$ chemistries. A polymer remainder 216, which may be a byproduct of the etching, is left on a bottom portion of the sidewall of the opening 214 after the etching of the second dielectric layer 208. There may be some loss of the first dielectric layer 206 from the etching. The etching is preferably stopped before the first dielectric layer 206 is etched through.

Figure 3B:
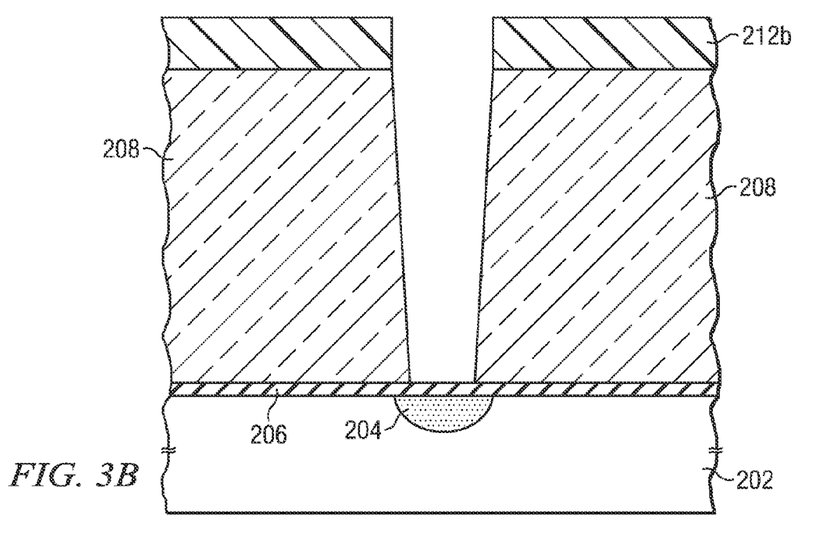

Referring to FIG. 3B, an etch, such as an anisotropic etch, is performed to remove the polymer remainder 216. A portion of the photo resist layer may also be removed in the etch leaving a shorter photo resist layer 212b. The etch may be an $O_2$ plasma ashing. The interface region 204 is protected from the removal process of the polymer remainder 216 by the presence of the first dielectric layer 206.

Figure 3C:
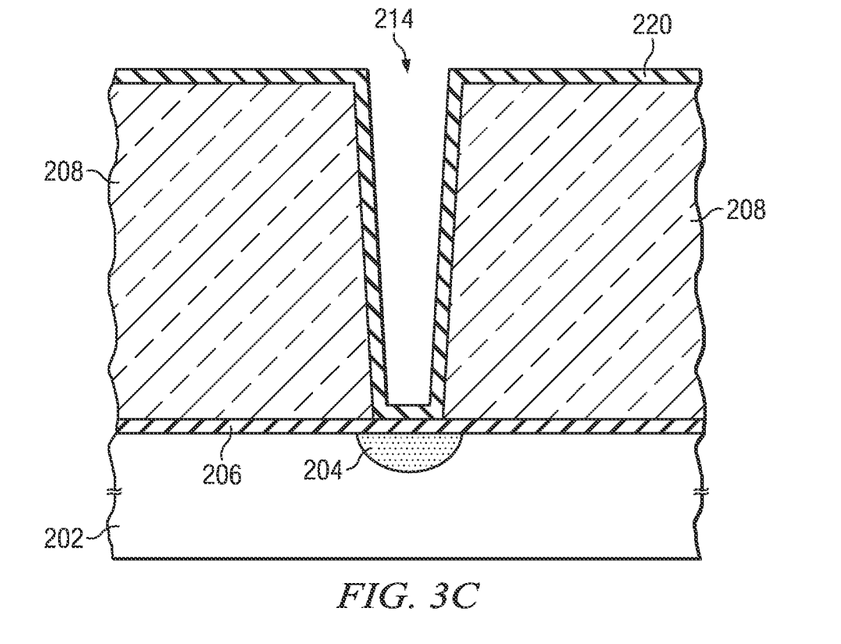

Referring to FIG. 3C, the photo resist layer 212b is removed and an insulating layer 220 is formed on the walls of the opening 214, the first dielectric layer 206 and the second dielectric layer 208. The insulating layer 220 provides prevention against a contact to contact short and may be, for example, a thin SiN liner, a tetraethyl orthosilicate (TEOS) layer, an undoped silicon glass (USG) layer, a SiON layer, a SiN layer formed by furnace low power (LP) process, or another conformal dielectric layer. An exemplary benefit of the insulating layer 220 is to seal the walls of the opening 214.

Figure 3D:
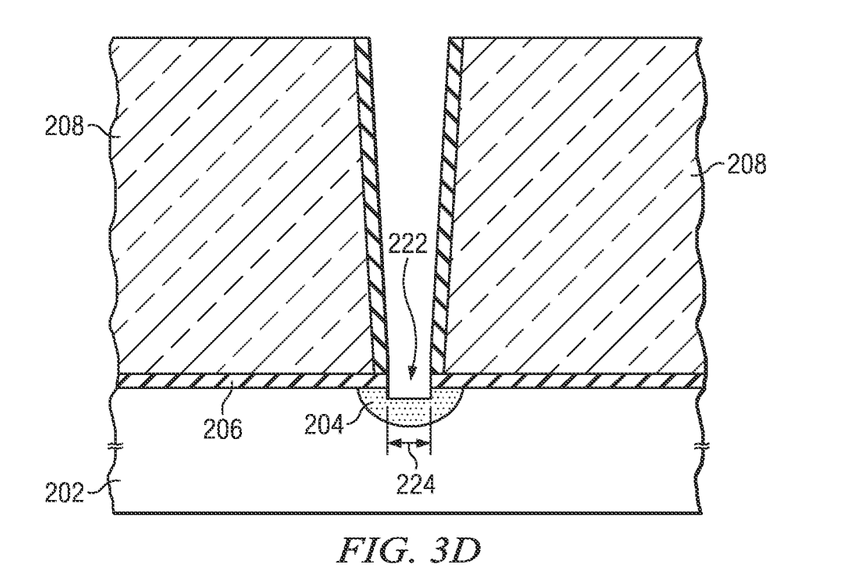

Referring to FIG. 3D, the insulating layer 220 is anisotropically etched (for example using a $CF_4$, $CHF_3$ or $CH_2F_2$ chemistry) exposing the interface region 204 at the opening 222 so that a conductive plug may be formed later. The etching may remove some material from the interface region 204.

A dimension 224 of the opening 222 is enlarged by the removal of the polymer remainder prior to the etching that provides the opening 222. Thus, a smoother contact hole may be provided because the discontinuity in the wall of the contact hole caused by the polymer remainder has been suppressed. The sidewall of the contact hole may be substantially smooth. The profile of opening 222 is more vertical than the profile of opening 214.

Exemplary benefits of the above-described process and structures include providing a larger contact area between a later formed contact plug and the substrate/interface region. Loss of the material of the interface region may also be suppressed by reducing the exposure of the interface region to etching.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for forming a semiconductor structure, comprising:
    forming a first dielectric layer over a substrate;
    forming a second dielectric layer over the first dielectric layer;
    patterning the second dielectric layer;
    forming a first opening in the second dielectric layer by etching; and
    forming a second opening in the first dielectric layer, wherein
    a profile of the second opening is more vertical than a profile of the first opening, wherein the forming the second opening in the first dielectric layer includes forming the second opening within the first opening.

2. The method according to claim 1, wherein the patterning the second dielectric layer includes forming a photo resist layer over the second dielectric layer and patterning the photo resist layer.

3. A method for forming a semiconductor structure, comprising:

forming a first dielectric layer over a substrate;

forming a second dielectric layer over the first dielectric layer;

patterning the second dielectric layer;

forming a first opening in the second dielectric layer by etching; and forming a second opening in the first dielectric layer, wherein a profile of the second opening is more vertical than a profile of the first opening, and the patterning the second dielectric layer includes forming a photo resist layer and a hard mask layer over the second dielectric layer and patterning the photo resist layer and the hard mask layer.

4. The method according to claim 3, further comprising:

removing the photo resist layer after the hard mask layer is patterned; and removing, in a clean process, a polymer remainder in the first opening.

5. The method according to claim 1, further comprising forming an insulating layer over the first and the second dielectric layers and a sidewall of the first opening.

6. The method according to claim 3, further comprising forming an insulating layer over the first and the second dielectric layers, a sidewall of the first opening, and the hard mask layer.

7. The method according to claim 5, wherein the insulating layer is a SiN layer.

8. The method according to claim 6, wherein the insulating layer is a SiN layer, a tetraethyl orthosilicate layer, an undoped silicon glass (USG) layer or a SiON layer.

9. The method according to claim 5, wherein the forming the second opening in the first dielectric layer includes forming an opening in the insulating layer.

10. The method according to claim 6, wherein the forming the second opening in the first dielectric layer includes forming an opening in the insulating layer.

11. A method for forming a semiconductor structure, comprising:

forming a first dielectric layer over a substrate;

forming a second dielectric layer over the first dielectric layer;

patterning the second dielectric layer, the patterning the second dielectric layer including forming a photo resist layer over the second dielectric layer and patterning the photo resist layer;

forming a first opening in the second dielectric layer by etching;

forming a second opening in the first dielectric layer; and forming an insulating layer over the first and second dielectric layers and a sidewall of the first opening after the removing the photo resist layer, wherein a profile of the second opening is more vertical than a profile of the first opening.

12. The method according to claim 11, wherein the insulating layer is a SiN layer, a tetraethyl orthosilicate layer, an undoped silicon glass (USG) layer or a SiON layer.

13. The method according to claim 1, wherein the vertical direction is defined as normal to the substrate.

* * * * *